United States Patent [19]
Hynecek

[11] Patent Number: 5,972,733
[45] Date of Patent: Oct. 26, 1999

[54] SELF-ALIGNED BARRIER PROCESS WITH ANTIBLOOMING DRAIN FOR ADVANCED VIRTUAL PHASE CHARGED COUPLED DEVICES

[75] Inventor: Jaroslav Hynecek, Richardson, Tex.

[73] Assignee: Texas Instruments Incorporated, Dallas, Tex.

[21] Appl. No.: 09/024,816

[22] Filed: Feb. 17, 1998

Related U.S. Application Data

[60] Provisional application No. 60/037,604, Feb. 18, 1997.

[51] Int. Cl.$^6$ .................................................. H01L 21/339
[52] U.S. Cl. ............................................. 438/79; 438/146
[58] Field of Search .................................. 438/60, 75, 76, 438/78, 79, 144, 146

[56] References Cited

U.S. PATENT DOCUMENTS

| | | | |
|---|---|---|---|
| 4,173,064 | 11/1979 | Farnow ...................................... | 438/79 |
| 4,994,875 | 2/1991 | Hynecek ................................. | 257/216 |
| 5,118,631 | 6/1992 | Dyck et al. ................................ | 438/79 |
| 5,151,380 | 9/1992 | Hynecek ................................. | 438/146 |
| 5,453,632 | 9/1995 | Hynecek et al. ......................... | 257/247 |
| 5,585,298 | 12/1996 | Stevens et al. ............................ | 438/79 |

*Primary Examiner*—Chandra Chaudhari
*Attorney, Agent, or Firm*—Alan K. Stewart; Wade James Brady, III; Richard L. Donaldson

[57] ABSTRACT

A method for making a virtual phase charge coupled device includes: forming a semiconductor region 24; forming a gate insulator layer 26 over the semiconductor region 24; forming a semiconductor layer over the gate insulator layer 26; forming first, second, and third openings in the semiconductor layer; implanting antiblooming barrier implants 36 in the semiconductor region 24 through the first opening; implanting virtual barrier implants 42 in the semiconductor region through the second opening; implanting clocked barrier implants 46 in the semiconductor region 24 through the third opening; forming semiconductor fillings in the first, second, and third openings; etching the semiconductor layer and semiconductor fillings to form clocked gates 28 and 30 and an antiblooming gate 32; implanting an antiblooming drain 48 aligned to the antiblooming gate 32; and implanting virtual gates 56, 58, and 60 aligned to the clocked gates 28 and 30 and the antiblooming gate 32.

10 Claims, 2 Drawing Sheets

SELF-ALIGNED BARRIER PROCESS WITH ANTIBLOOMING DRAIN FOR ADVANCED VIRTUAL PHASE CHARGED COUPLED DEVICES

This application claims priority under 35 USC §119 (e) (1) of provisional application Ser. No. 60/037,604, filed Feb. 18, 1997.

FIELD OF THE INVENTION

This invention generally relates to charge coupled devices, and more particularly relates to virtual phase charge coupled device.

BACKGROUND OF THE INVENTION

Prior art virtual phase CCD processes are only partially self-aligned. The clocked barrier as well as the virtual barrier are defined by separate masks. This presents a problem of alignment accuracy when the pixel size is reduced. Only the virtual gate P+ region is self aligned to the polysilicon and the virtual well implant is self aligned only at one edge. Both barriers, clocked and virtual are defined by a masking process which has a tolerance limit. This limit becomes a problem when the barriers have submicron dimensions which are necessary for small pixel CCD image sensors. Another problem in the prior art occurs in the virtual barrier region. There is an overlap of the clocked well "As" implant which is compensated by the P+ boron implant to obtain a self aligned edge of the clocked well to the virtual barrier. However, the compensation is not perfect which causes a small retrograde well (parasitic well) in the barrier region. This in turn causes difficulty for charge transfer efficiency, since a small amount of charge can be trapped in this well.

SUMMARY OF THE INVENTION

Generally, and in one form of the invention, a method for making a virtual phase charge coupled device includes: forming a semiconductor region; forming a gate insulator layer over the semiconductor region; forming a semiconductor layer over the gate insulator layer; forming first, second, and third openings in the semiconductor layer; implanting antiblooming barrier implants in semiconductor region through the first opening; implanting virtual barrier implants in the semiconductor region through the second opening; implanting clocked barrier implants in the semiconductor region through the third opening; forming semiconductor fillings in the first, second, and third openings; etching the semiconductor layer and semiconductor fillings to form clocked gates and an antiblooming gate; implanting an antiblooming drain aligned to the antiblooming gate; and implanting virtual gates aligned to the clocked gates and the antiblooming gate.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
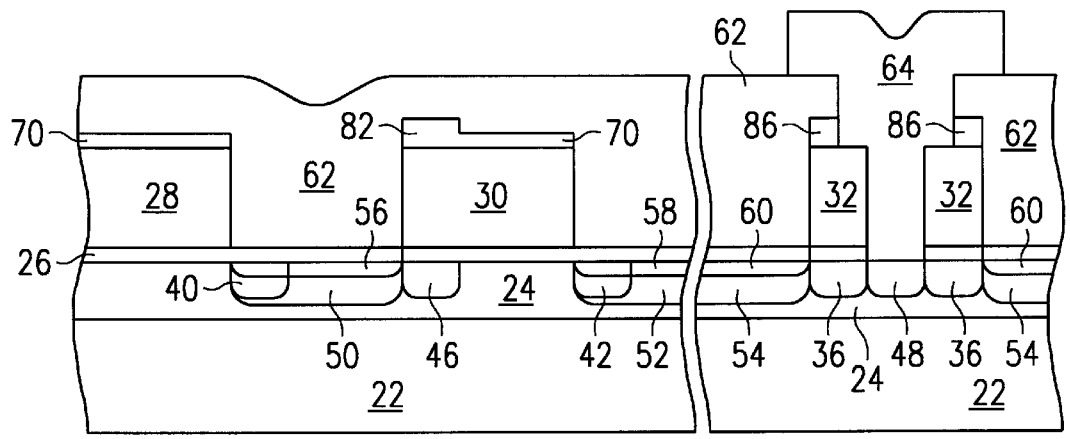
FIG. 1 is a cross-section of a first preferred embodiment self aligned charge coupled device structure with antiblooming drain.

FIG. 1 is a cross-section of a first preferred embodiment self aligned virtual phase charge coupled device (CCD) structure with antiblooming drain. The structure of FIG. 1 includes P type semiconductor layer 22, N type semiconductor region (buried Channel) 24, gate insulator layer (oxide) 26, clocked gate regions (polysilicon) 28 and 30, antiblooming gate (polysilicon) 32, insulator regions (oxide) 70, 82, and 86, antiblooming barrier implant 36, virtual barrier implants 40 and 42, clocked barrier implant 46, antiblooming drain implant 48, N type virtual gate threshold adjust implants 50, 52, and 54, P+ virtual gate implants 56, 58, and 60, and insulator layer (oxide overcoat) 62, conductive contact (aluminum) 64.

Figure 2:
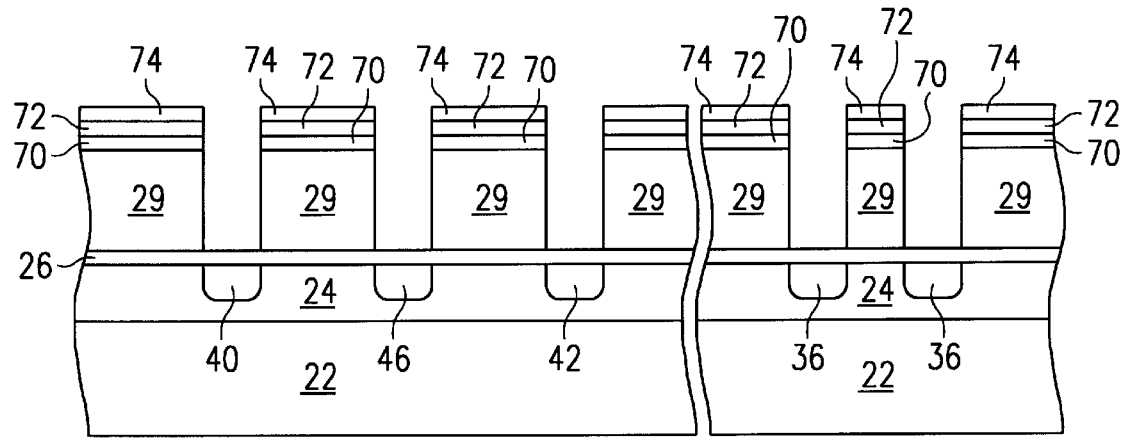
FIGS. 2–5 show the device of FIG. 1 at four stages of fabrication.

FIGS. 2–5 illustrate successive steps in a process for fabricating the virtual phase CCD with antiblooming drain according to the preferred embodiment, as shown in FIG. 1. Referring first to FIG. 2, the process begins with a silicon substrate 22 of P type conductivity. Gate oxide layer 26 is then grown by oxidation to the desired thickness, for example, about 400 angstroms. Next an N type buried channel region 24 is formed by N type doping. Then a layer of polysilicon (semiconductor) 29 is deposited over the oxide layer 26 and doped to be conductive. For the preferred embodiment, about 4000 Angstroms of polysilicon is deposited. The polysilicon layer 29 may be doped in place by a dopant such as phosphoric oxytrichloride ($POCl_3$). Alternatively, the polysilicon can be doped at a later point in the process by ion implantation. A pad oxide layer 70 is then grown over the polysilicon layer 29 to a thickness of, for example, about 400 angstroms. A nitride layer 72 with a thickness of about 400 angstroms is deposited on oxide layer 70. A TEOS layer 74 with a thickness of about 600 angstroms i, deposited on the nitride layer 72. Then, the TEOS layer 74, nitride layer 72, oxide layer 70, and polysilicon layer 29 are patterned and etched for the antiblooming barrier, virtual barrier, and clocked barrier implants, as shown in FIG. 2. The antiblooming barrier implant 36 is then patterned and implanted using a P type dopant such as boron. Next, the virtual barrier implants 40 and 42 are patterned and implanted using a P type dopant such as boron. Then the clocked barrier implant 46 is patterned and implanted using a P type dopant such as boron.

Figure 3:
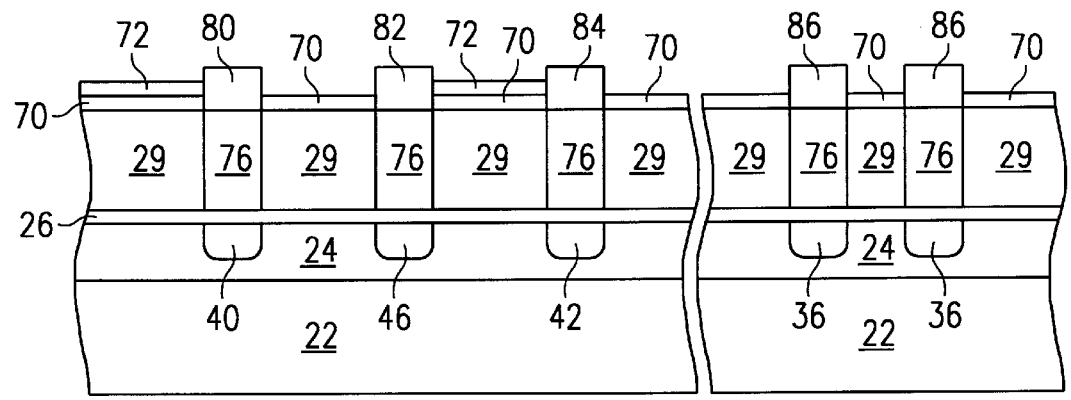
Figure 4:
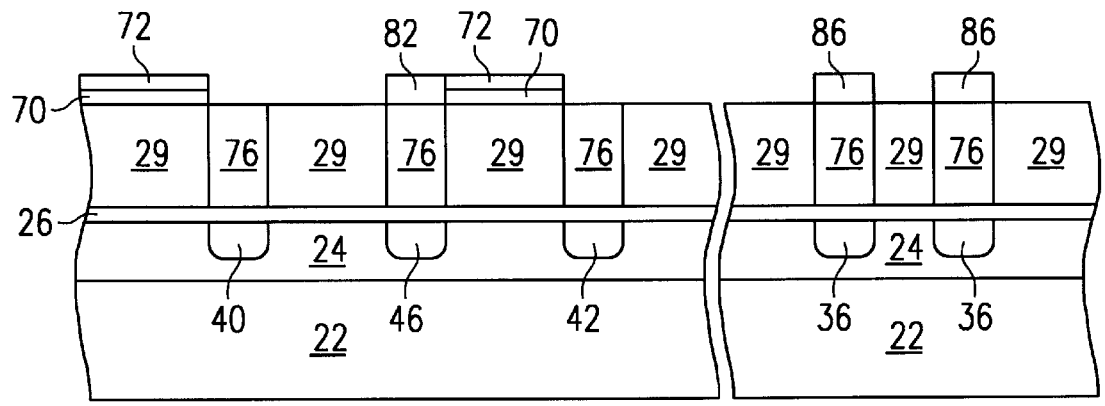

Polysilicon (semiconductor fillings) 76 is then deposited and etched back to fill the regions above the antiblooming barrier implant 36, virtual barrier implants 40 and 42, and clocked barrier implant 46, as shown in FIG. 3. Then the polysilicon 76 is doped to be conductive. Polysilicon 76 (along with polysilicon 29, if not doped previously) is doped by ion implantation. Next, the TEOS layer 74 is etched off and the exposed polysilicon is oxidized to form oxide regions 80, 82, 84, and 86, as shown in FIG. 3. The virtual gate overlay is then patterned and the nitride layer 72 above the virtual wells is etched off, as shown in FIG. 3. The oxide regions above the virtual gates are also etched off, as shown in FIG. 4. Then polysilicon regions above the virtual gates and nitride regions above the clocked gates are etched off to form clocked gates 28 and 30, and antiblooming gate 32, as shown in FIG. 5.

Figure 5:
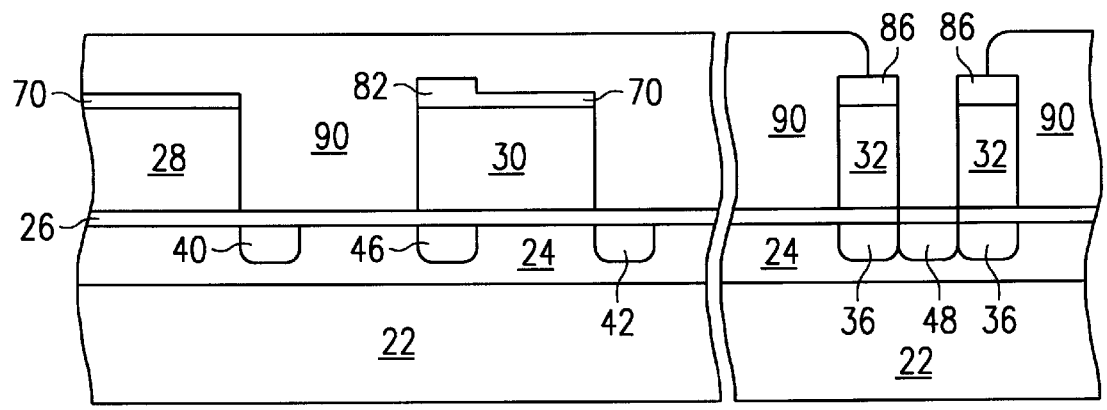

The N+ type antiblooming drain 48 is then patterned using photoresist 90 and implanted using a dopant such as phosphorus, as shown in FIG. 5. The channel stops (not shown in the drawings) are then patterned and implanted using a dopant such as boron. Next, the virtual gates are patterned and threshold adjust implants 50, 52, and 54 are implanted using a dopant such as phosphorus. Then the P+ type virtual electrodes (virtual gate) 56, 58, and 60 are implanted using a dopant such as boron. Interlevel oxide 62 is then deposited. Next contact holes are etched and the conductive contact 64 (aluminum) is deposited, patterned, and etched, as shown in FIG. 1. A final oxide protective overcoat (not shown) is deposited after the conductive contact 64. Then an aluminum light shield (not shown) is formed.

The above described process has only four critical masks. The first one is for the buried channel which has a narrow surface channel opening on the order of 0.8 micrometers which define the CCD channels. The second is for the polysilicon which has narrow openings for the antiblooming barrier, virtual barriers, and clocked barriers on the order of 0.8 micrometers. The third is the channel stop implant opening on the order of 0.8 micrometers. The fourth is the contact hole openings. The alignment of all the masks is not critical because this is a self aligned process except for the contact and metal. Overlay masks define the previously patterned geometries and have large alignment tolerances.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for making a virtual phase charge coupled device comprising:

forming a semiconductor region;

forming a gate insulator layer over the semiconductor region;

forming a semiconductor layer over the gate insulator layer;

forming first, second, and third openings in the semiconductor layer;

implanting antiblooming barrier implants in the semiconductor region through the first opening;

implanting virtual barrier implants in the semiconductor region through the second opening;

implanting clocked barrier implants in the semiconductor region through the third opening;

forming semiconductor fillings in the first, second, and third openings;

etching the semiconductor layer and semiconductor fillings to form clocked gates and an antiblooming gate;

implanting an antiblooming drain aligned to the antiblooming gate; and implanting virtual gates aligned to the clocked gates and the antiblooming gate.

2. The method of claim 1 wherein the semiconductor layer is polysilicon.

3. The method of claim 1 wherein the gate insulator layer is oxide.

4. The method of claim 1 wherein the semiconductor region is N type.

5. The method of claim 1 wherein the antiblooming barrier implants are P type.

6. The method of claim 1 wherein the virtual barrier implants are P type.

7. The method of claim 1 wherein the clocked barrier implants are P type.

8. The method of claim 1 wherein the antiblooming drain is N+ type.

9. The method of claim 1 wherein the virtual gate is P+ type.

10. The method of claim 1 further comprising forming threshold adjusting implants in the virtual gates.

* * * * *